United States Patent
Moon

(10) Patent No.: US 6,999,407 B2
(45) Date of Patent: Feb. 14, 2006

(54) SPEED NEGOTIATION DEVICE AND METHOD

(75) Inventor: Jae-young Moon, Suwon (KR)

(73) Assignee: Samsung Electronics Co., Ltd., Suwon-city (KR)

( * ) Notice: Subject to any disclaimer, the term of this patent is extended or adjusted under 35 U.S.C. 154(b) by 849 days.

(21) Appl. No.: 09/973,563

(22) Filed: Oct. 9, 2001

(65) Prior Publication Data

US 2002/0130795 A1 Sep. 19, 2002

Related U.S. Application Data

(60) Provisional application No. 60/276,267, filed on Mar. 15, 2001.

(51) Int. Cl.
*H04J 15/00* (2006.01)
*H04J 3/02* (2006.01)

(52) U.S. Cl. .......................................... 370/215; 370/538
(58) Field of Classification Search ................. 370/215, 370/230.1, 235, 532–533, 535–538, 412, 370/429; 375/308, 329
See application file for complete search history.

(56) References Cited

U.S. PATENT DOCUMENTS

| 5,159,278 A | | 10/1992 | Mattison | |
|---|---|---|---|---|
| 5,541,957 A | * | 7/1996 | Lau | 375/257 |
| 6,658,045 B1 | * | 12/2003 | Jin | 375/141 |
| 2002/0019952 A1 | * | 2/2002 | Ueno | 713/500 |
| 2002/0122477 A1 | * | 9/2002 | Murata | 375/225 |

FOREIGN PATENT DOCUMENTS

| DE | 4123007 | | 1/1993 |
|---|---|---|---|
| EP | 001241794 A2 | * | 9/2002 |

* cited by examiner

*Primary Examiner*—Duc Ho
*Assistant Examiner*—Phuongchau Ba Nguyen
(74) *Attorney, Agent, or Firm*—F. Chau & Associates, LLC

(57) ABSTRACT

A device and method for data rate selection in data transmission is provided, having a first register for storing an N bit data upon clocking by a first clock; a second at least one register for storing the N bit data upon clocking by a second clock, the second clock having a clock rate of two times the clock rate of the first clock; a circuit for receiving the N bit data output from the first register and outputting a first half of the N bit data during a first phase of the first clock and outputting a second half of the N bit data during a second phase of the first clock; and a multiplexer for receiving as first inputs the output of the circuit and second inputs the output of the second at least one register, wherein the multiplexer outputs the first inputs as a lower speed data and outputs the second inputs as a higher speed data based on a rate select signal.

18 Claims, 5 Drawing Sheets

SPEED NEGOTIATION DEVICE AND METHOD

CROSS-REFERENCE

This application claims priority to Provisional Application, Ser. No. 60/276,267, filed on Mar. 15, 2001. The disclosure therein is incorporated by reference herein.

BACKGROUND OF THE INVENTION

1. Technical Field

The present invention is directed to a device and a method for processing data for transfer through a data link; in particular, a method and a device for controlling the speed of data flow to a parallel to serial converter.

2. Discussion of Related Art

In data link and data transmission technology, a high bandwidth transmission medium, e.g., fiber optics, is used to transmit data serially at high speed. Prior to transmission of data through the high bandwidth medium, data is preprocessed by processing circuitry. For an N bit data, N latches are used to latch the N bits at a given clock rate to output onto an output bus. The N bit data on the output bus is then converted to serial data by a parallel to serial converter. Serial data is then output from the parallel to serial converter and transmitted through the high bandwidth medium. The data is received serially at the other end of the high bandwidth medium, and converted back to parallel data for processing. As an example, a Fibre Channel data link typically has processing circuitry for processing a 10-bit data. A 10-bit latch receives the 10-bit data and is clocked at the speed of 1,0625 MHz. The 10-bit data at the output is converted to serial data by a parallel to serial converter for transmission through a fibre data link. Generally, the data transmitted through the fibre or transmission medium is received serially at the end of the fibre link and the serial data is converted to parallel for processing at the receiving end.

With recent increased demand for high speed data links for operating in different environments, such as computer to computer networking or computer to peripheral networking, a need exists for a data processing device and method to transmit and receive data through the data link at selectably different speeds.

SUMMARY OF THE INVENTION

A device for data rate selection in data transmission is provided, comprising: a first register for storing an N bit data upon clocking by a first clock; a second at least one register for storing the N bit data upon clocking by a second clock, the second clock having a clock rate of two times the clock rate of the first clock; a circuit for receiving the N bit data output from the first register and outputting a first half of the N bit data during a first phase of the first clock and outputting a second half of the N bit data during a second phase of the first clock; and a multiplexer for receiving as first inputs the output of the circuit and second inputs the output of the second at least one register, wherein the multiplexer outputs the first inputs as a lower speed data and outputs the second inputs as a higher speed data based on a rate select signal. The device further including a parallel to serial converter for receiving the outputs of the multiplexer and providing serialized data output.

Preferably, the serialized data is output at a rate of about 2,125 MBAUD. The circuit includes N two-to-one multiplexers for receiving at its first inputs the first half of the N-bit data and receiving at its second inputs the second half of the N-bit data, wherein each of the first half of the N-bit data is connected to two first inputs of the N two-to-one multiplexers, and wherein the two to one multiplexer is controlled by an inverted version of the first clock, and the inverted version of the first clock is delayed to control the multiplexer.

According to one embodiment of the present invention, the second at least one register comprises third and forth registers, the third register for receiving the N bit data, the forth register for receiving the outputs of the third register, the forth register being clocked by an inverted version of the second clock.

A method of speed negotiation in a data link is also provided, comprising the steps of receiving an N bit parallel data at a first low speed path and a second high speed path; clocking the first path with a first clock, the first clock being a first version of a reference clock; clocking the second path with a second clock, the second clock being a second version of the reference clock, the second clock is at a higher speed than the first clock; adjusting the timing of outputting the N bit data from the first path by a factor equal to (first clock speed) divided by (second clock speed); and outputting the N bit data from either the first or the second path at the first low speed or the second high speed, respectively.

The method according to an aspect of the invention further includes the step of converting the N bit data output from the first or second paths to provide serial data output, wherein the second clock speed is twice the first clock speed.

Preferably, the step of adjusting the timing includes dividing the first clock into a first phase clock and a second phase clock and outputting M bits of the N bit data, M being less than N, during the first phase clock, and outputting the N−M bits of the N bit data during the second phase clock. The step of outputting the N bit data includes multiplexing between the first and the second paths, said multiplexing being control by a rate select bit.

According to still another aspect of the invention, a device for speed selection of a data link is provided comprising means for receiving an N bit parallel data at a first low speed path and a second high speed path; means for clocking the first path with a first clock, the first clock being a first version of a reference clock; means for clocking the second path with a second clock, the second clock being a second version of the reference clock, the second clock is at a higher speed than the first clock; means for adjusting the timing of outputting the N bit data from the first path by a factor equal to (first clock speed) divided by (second clock speed); and means for outputting the N bit data from either the first or the second path at the first low speed or the second high speed, respectively.

Preferably, the means for adjusting includes an N bit two to one multiplexer for receiving at its first inputs the first half of the N bit data and receiving at its second inputs the second half of the N bit data. The means for clocking the second path includes a first register for storing the N bit parallel data with the second clock at a first stage and a second register for storing the N bit parallel data at a second stage with an inverted version of the second clock. And, the means for outputting includes a multiplexer for selecting the N bit data from the first or second path under control by a rate select bit.

BRIEF DESCRIPTION OF THE DRAWINGS

The objects and advantages of the present invention will become more apparent by describing in detail preferred embodiments thereof with reference to the attached drawings in which.

DETAILED DESCRIPTION OF THE PREFERRED EMBODIMENTS

Figure 1:
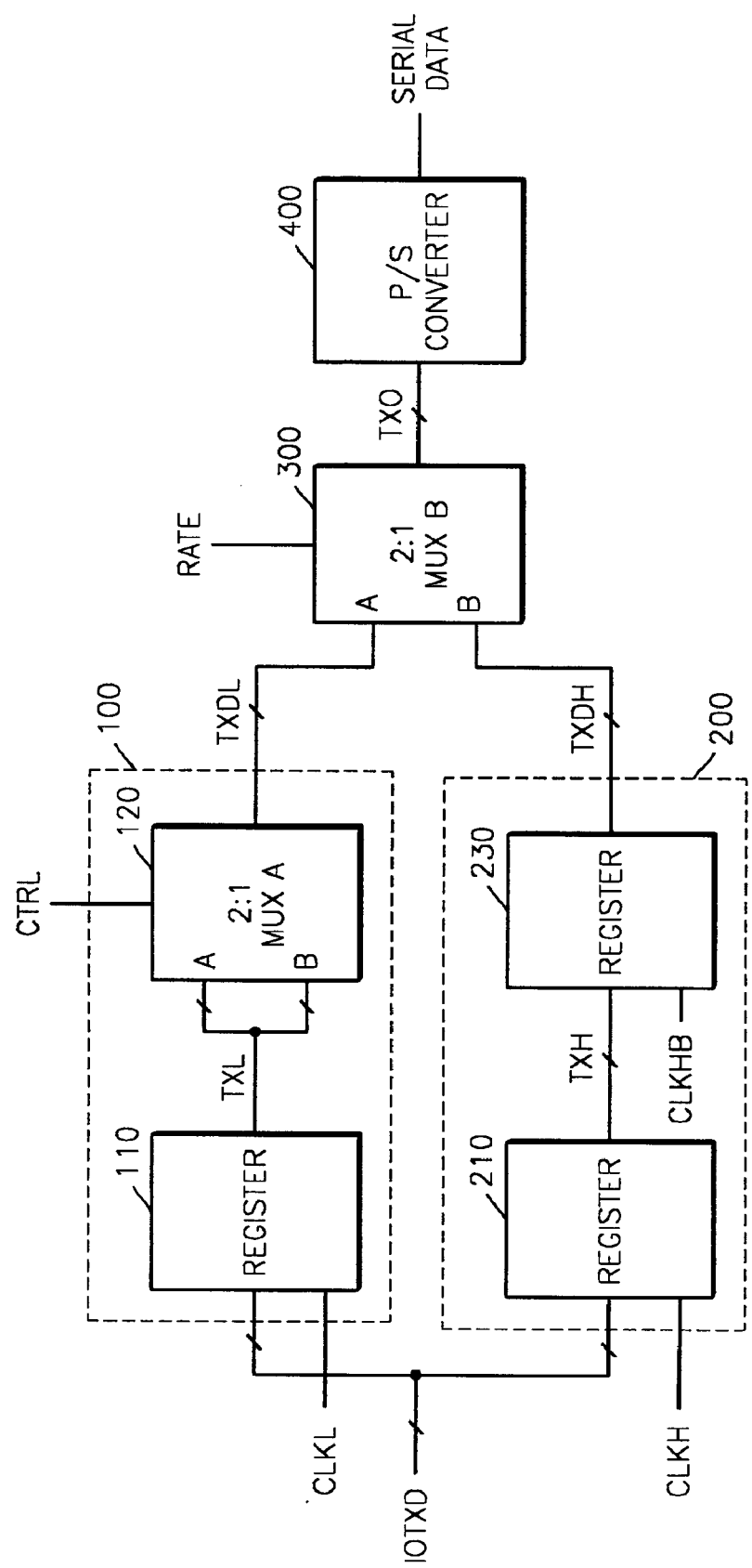
FIG. 1 shows a block diagram of a device for processing data to be transfer according to a preferred embodiment of the present invention.

FIG. 1 shows a block diagram of a device for processing data and providing a selectable data flow rate prior to parallel to serial converting according to a preferred embodiment of the present invention. Data input at IOTXD is received in parallel by two data paths, a lower speed path 100 and a higher speed path 200. The data output at the lower speed path 100 at TXDL and the data output from the higher speed path 200 at TXDH are input to a multiplexer 300. A rate control signal, which can be externally applied, selects one of the two inputs of the multiplexer 300 for output at TX0. The data processing from IOTXD input to TX0 output is processed in parallel at each stage. For example, if the data at input IOTXD is 10 bits wide, the data at output TX0 is also 10 bits wide. A parallel to serial converter 400 converts the parallel TX0 data to serial data for transmission over a high bandwidth medium (not shown).

Advantageously, the device as shown in FIG. 1 provides parallel data at selectable data rates to the parallel to serial converter. A rate is selectable by a rate signal input to multiplexer 300. The different selectable data speed is determined by the ratio of clock speed of CLKH compared to CLKL. According to the illustrative embodiment as shown in FIG. 1, CLKH operates at twice the frequency as CLKL; therefore, the data flow rate selectable is regular data rate or double data rate. Preferably, CLKL operates at a clock bit rate of 1,062.5 MBAUD and CLKH operates at a bit rate of 2,125 MBAUD. In operation, data at IOTXD input is received by a register 110 and clocked in by CLKL. The circuits of lower speed path 100, higher speed path 200 and multiplexer 300 have the same width as the length of the input data to be processed at IOTXD. For example, if input at IOTXD is 2N bits wide, the register 110 includes 2N flip-flops. Data latched by the register 110 is output to a circuit for conforming the lower speed data to the higher speed data from the higher speed path 200. According to the present embodiment, a 2 to 1 multiplexer 120, 2N bits wide, processes the data output from the register 110.

Figure 2:
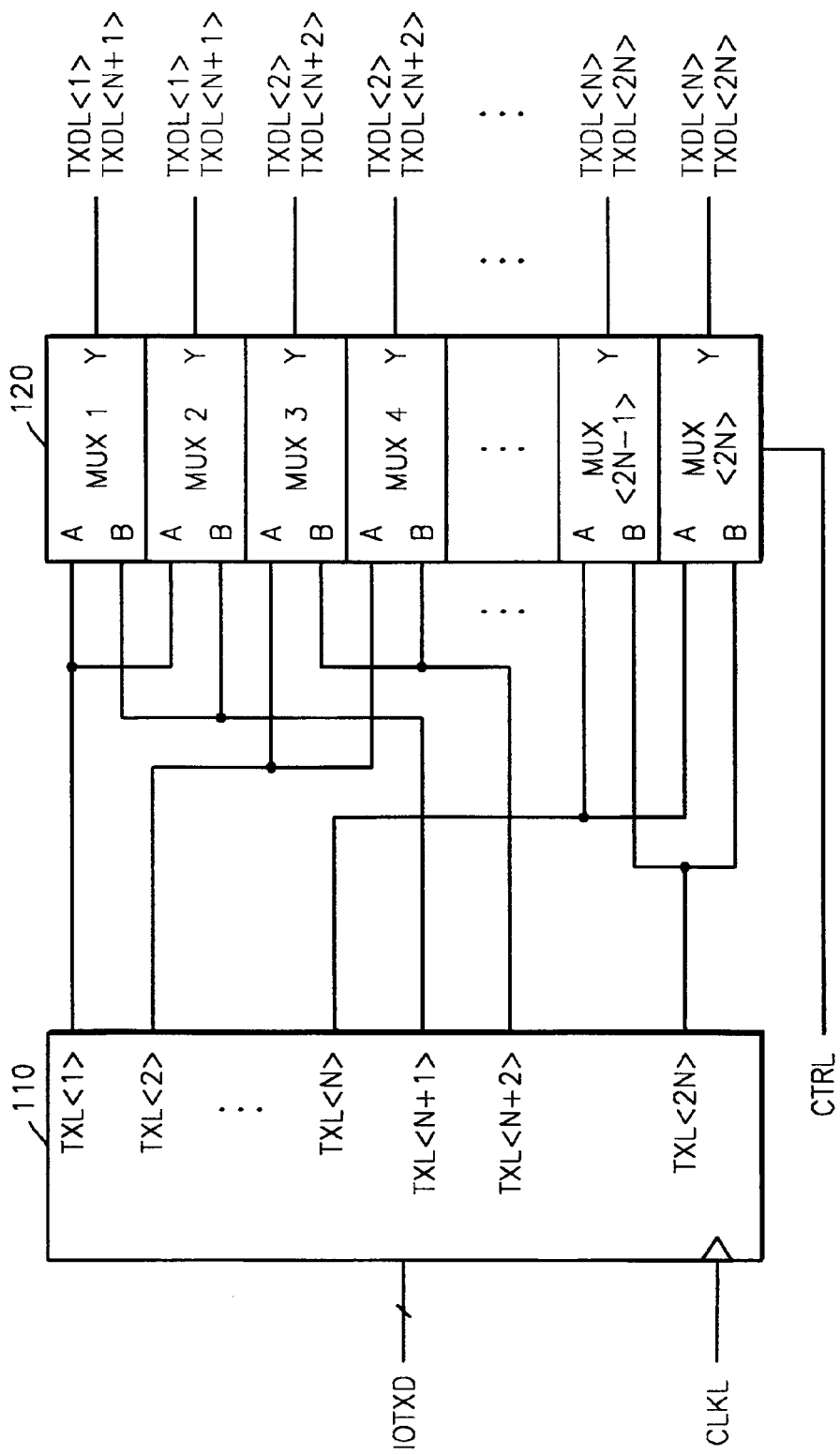
FIG. 2 shows a circuit for use in a lower speed path according to an embodiment of the present invention.

The operation of register 110 and multiplexer 120 is further explained with reference to FIG. 2. As shown, the input at IOTXD (1, 2N) is received by the register 110. If IOTXD is 10 bits wide, N is equaled to 5. The first half of the output at the register 110 are connected to one of the two input ports (A, B) of multiplexer 120, e.g., each of the outputs TXL (1,N) is connected to two adjacent inputs of Port A of multiplexer 120. For example, TXL (1) is connected to Port A of the first two multiplexers MUX 1 and MUX 2 of multiplexer 120. TXL (2) is connected to Port A of MUX 3 and MUX 4 of multiplexer 120, and TXL (N) is connected to Port A of MUX (2N-1) and MUX (2N). Likewise, the second half of the output at the register 110 is connected to the B ports of multiplexer 120. For example, TXL (6 or N+1) is connected to the B port of MUX 1 and MUX 2, TXL (N+2) is connected to MUX 2 to the B port of MUX 3 and MUX 4 and TXL (2N, or bit 10) is connected to MUX 9 and MUX 10 of multiplexer 120. Control signal CTRL, which preferably is a duplicate of CLKL, except it is inverted, controls the output select of multiplexer 120, to output either the first half of TXL (1, N) at Port A when CTRL is at logic low or output the second half of TXL (N+1, 2N) at Port B when CTRL is at logic high. Thus, one half of TXL (1, 2N) data is outputted during each phase of CTRL. The entire 2N bits input at IOTXD is outputted in one cycle of CTRL.

Figure 3:
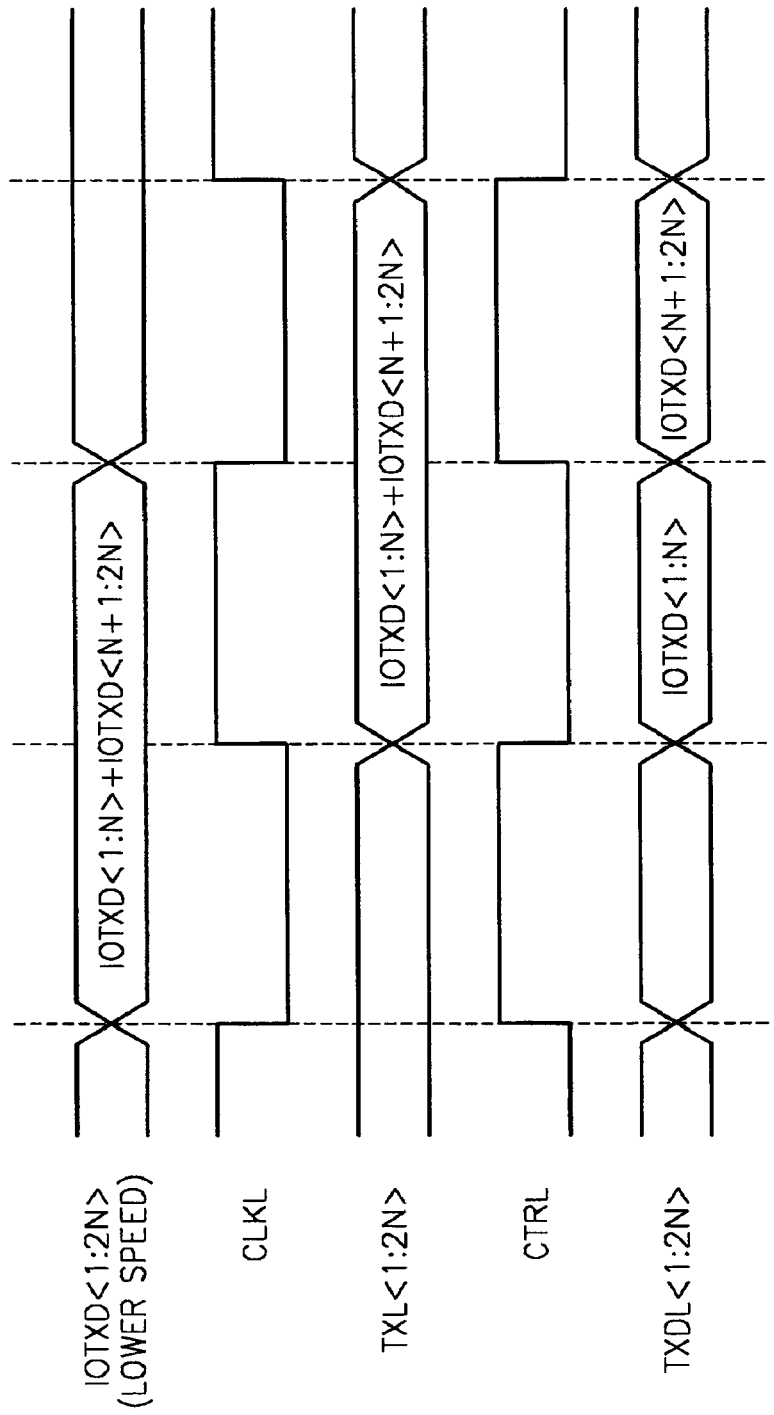
FIG. 3 shows a timing diagram of the data flow through the lower speed path.

FIG. 3 shows the timing diagram of IOTXD (1, 2N) as it traverses through the lower speed path 100. As shown, IOTXD (1, 2N) is clocked by the low to high transition of CLKL to output TXL (1, 2N) at the output of the register 110. The CTRL signal selects multiplexer 120 to output Port A inputs TXL (1,N) when CTRL is at logic low and the output Port B inputs TXL (N+1, 2N) when CTRL is at logic high. CTRL can be delayed to better control the timing of outputting TXL (1, N) or TXL (N+1, 2N).

Data flow through the higher speed path is explained with reference to FIG. 1. The higher speed path 200 preferably includes register 210 and the register 230. The register 210 receives in parallel input IOTXD (1,2N) and it is clocked by CLKH. The output of the register 210 is input to the register 230, which according to the present embodiment includes 2N flip-flops, which is clocked by CLKHB, an inverted version of CLKH. There are 2N flip-flops in the register 210 and register 230 to correspond to the 2N bits of IOTXD.

Figure 4:
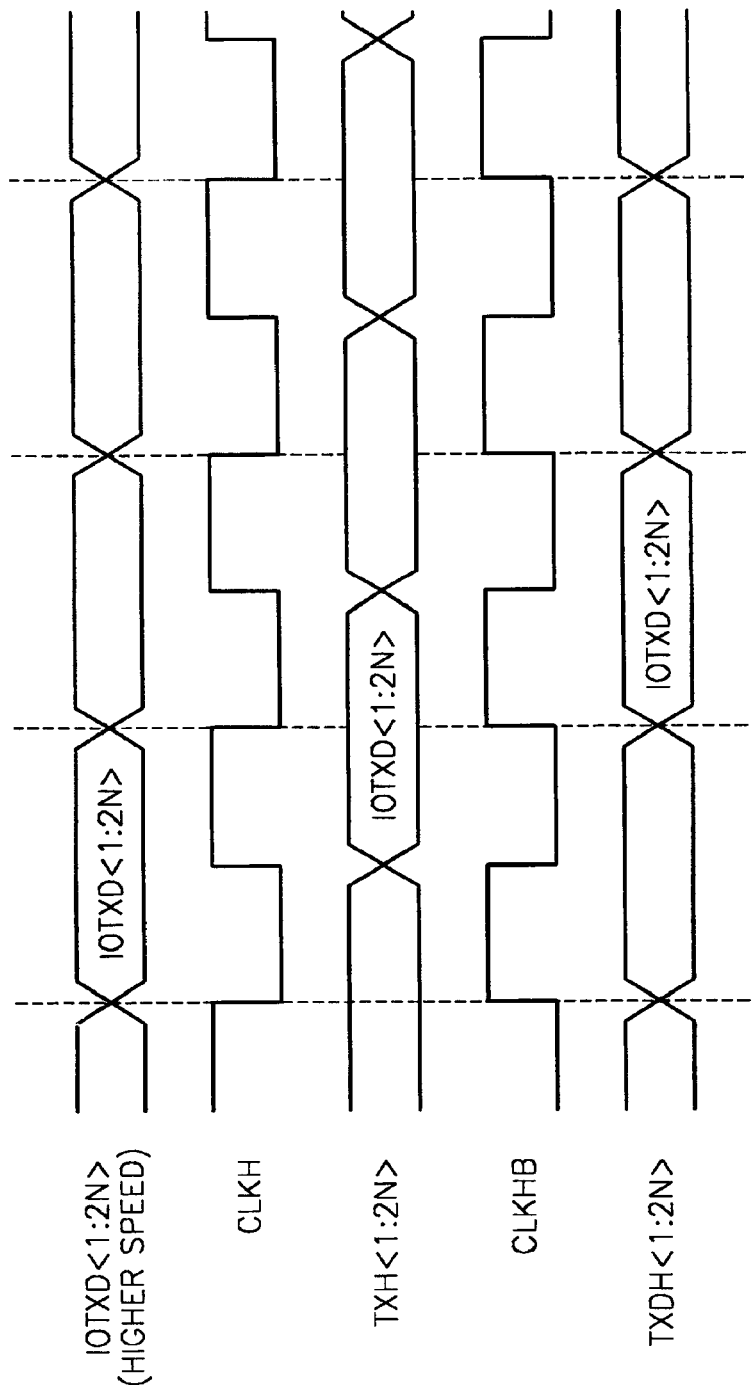
FIG. 4 shows a timing diagram of the data flow through the higher speed path.

FIG. 4 shows the timing diagram of IOTXD (1, 2N) through the higher speed path 200. IOTXD (1, 2N) is first clocked by CLKH at the register 210 and the data output of the register 210 is clocked by CLKHB at the register 230. Because CLKHB is an inverted version of CLKH, the data is output at the register 230 when CLKH goes from high to low. As compared to FIG. 3, it can be seen that the clock rate of CLKH is at twice the frequency of CLKL and data IOTXD (1, 2N) is output in one clock cycle of CLKH. As such, the data rate through higher speed path 200 is twice the data rate through the lower speed path 100.

The output of the lower speed path 100 is input to Port A of multiplexer 300 and the output of the higher speed path 200 is input to Port B of multiplexer 300. Control signal RATE, which can be externally applied, selects the slower A port or the faster B port to output at Y as TX0 (1,2N) to parallel to serial converter 400.

Figure 5:
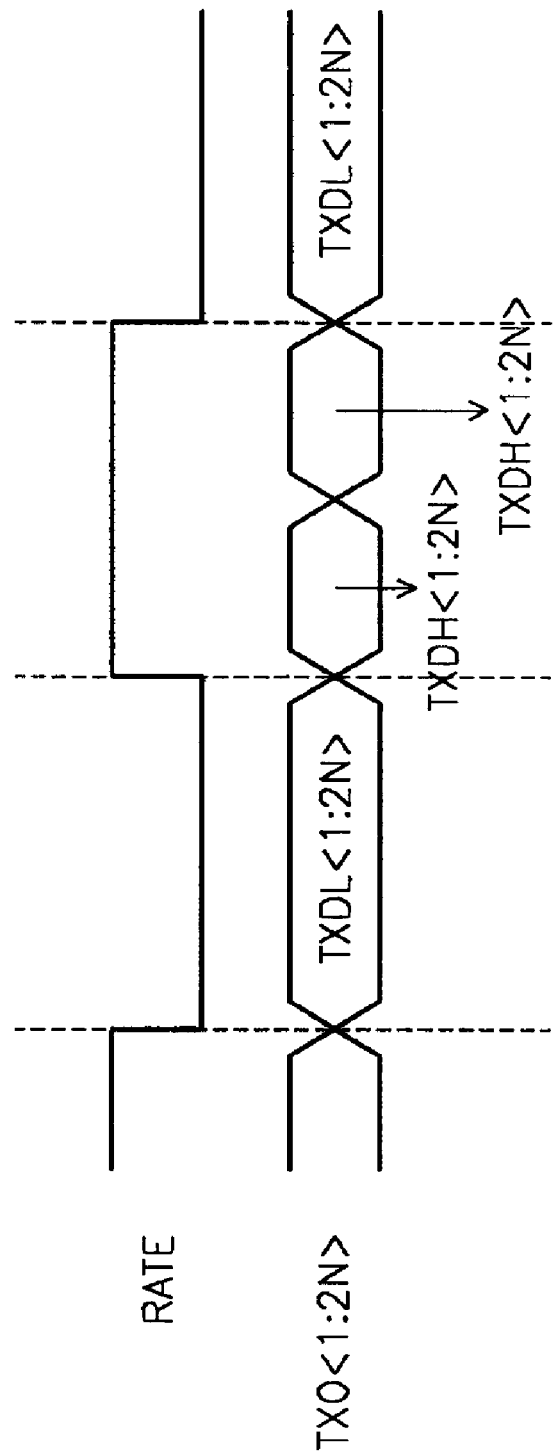
FIG. 5 shows a timing diagram of data output and rate control according to a preferred embodiment of the present invention.

FIG. 5 shows the timing diagram of the signal output of multiplexer 300 controlled by rate input. As shown, when RATE is at logic low, the slower data rate is selected and output at TXO. When RATE is at logic high, the higher data rate is selected.

It can be readily appreciated by one skilled in the art that the difference in data rate through the higher speed path compared to the slower speed path is determined by the ratio of the clock rates CLKH/CLKL. For example, if CLKH is five times the speed of CLKL, the data rate output for the higher speed path is five times that of the slower speed path. One skilled in the art also appreciates that proportional adjustments in size in multiplexer 120 is needed to conform the slower data rate to the higher rate, essentially as shown in the embodiment above.

Having described embodiments of a system and method for speed negotiation, it is noted that modifications and variation can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claims and desired protected by Letters Patent is set for in the appended claims.

What is claimed is:

1. A device for speed negotiation in data transmission, comprising:
   a first register for storing an N bit data upon clocking by a first clock;
   a second at least one register for storing the N bit data upon clocking by a second clock, the second clock having a clock rate of two times the clock rate of the first clock;
   a circuit for receiving the N bit data output from the first register and outputting a first half of the N bit data during a first phase of the first clock and outputting a second half of the N bit data during a second phase of the first clock; and
   a multiplexer for receiving as first inputs the output of the circuit and second inputs the output of the second at least one register, wherein the multiplexer outputs the first inputs as a lower speed data and outputs the second inputs as a higher speed data based on a rate select signal.

2. The device of claim 1, further including a parallel to serial converter for receiving the outputs of the multiplexer and providing serialized data output.

3. The device of claim 2, wherein the serialized data is output at a rate of about 2,125 MBAUD.

4. The device of claim 1, wherein the circuit includes N two-to-one multiplexers for receiving at its first inputs the first half of the N-bit data and receiving at its second inputs the second half of the N-bit data.

5. The device of claim 1, wherein each of the first half of the N-bit data is connected to two first inputs of the N two-to-one multiplexers.

6. The device of claim 4, wherein the two to one multiplexer is controlled by an inverted version of the first clock.

7. The device of claim 6, wherein the inverted version of the first clock is delayed to control the multiplexer.

8. The device of claim 1, wherein the second at least one register comprises third and forth registers, the third register for receiving the N bit data, the forth register for receiving the outputs of the third register, the forth register being clocked by an inverted version of the second clock.

9. A method of speed negotiation in a data link, comprising the steps of:
   receiving an N bit parallel data at a first low speed path and a second high speed path;
   clocking the first path with a first clock, the first clock being a first version of a reference clock;
   clocking the second path with a second clock, the second clock being a second version of the reference clock, the second clock is at a higher speed than the first clock;
   adjusting the timing of outputting the N bit data from the first path by a factor equal to the speed of the first clock divided by the speed of the second clock; and
   outputting the N bit data from either the first or the second path at the first low speed or the second high speed, respectively, wherein the step of outputting the N bit data including multiplexing between the first and second paths, said multiplexing being control by a rate select bit.

10. The method of claim 9, further including the step of converting the N bit data output from the first or second paths to provide serial data output.

11. The method of claim 10, wherein the serial data is output at about 2,125 MBAUD.

12. The method of claim 9, wherein the second clock speed is twice the first clock speed.

13. The method of claim 9, wherein the step of adjusting the timing includes dividing the first clock into a first phase clock and a second phase clock and outputting M bits of the N bit data, M being less than N, during the first phase clock, and outputting the N-M bits of the N bit data during the second phase clock.

14. The method of claim 9, wherein the reference clock operates at about 106.25 MHz.

15. The method of claim 9, wherein the step of clocking the second path includes latching the N bit parallel data with the second clock at a first stage and latching the N bit parallel data at a second stage with an inverted version of the second clock.

16. A device for negotiating speed of a data link, comprising:
   means for receiving an N bit parallel data at a first low speed path and a second high speed path;
   means for clocking the first path with a first clock, the first clock being a first version of a reference clock;
   means for clocking the second path with a second clock, the second clock being a second version of the reference clock, the second clock is at a higher speed than the first clock;
   means for adjusting the timing of outputting the N bit data from the first path by a factor equal to the speed of the first clock divided by the speed of the second clock; and
   means for outputting the N bit data from either the first or the second path at the first low speed or the second high speed, respectively, wherein said means for outputting includes a multiplexer for selecting the N bit data from the first or second path under control by a rate select bit.

17. The device of claim 16, wherein said means for adjusting includes an N bit two to one multiplexer for receiving at its first inputs the first half of the N bit data and receiving at its second inputs the second half of the N bit data.

18. The device of claim 16, wherein said means for clocking the second path includes a first register for storing the N bit parallel data with the second clock at a first stage and a second register for storing the N bit parallel data at a second stage with an inverted version of the second clock.

* * * * *